US012581720B2

(12) United States Patent
Lin et al.

(10) Patent No.: US 12,581,720 B2
(45) Date of Patent: Mar. 17, 2026

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Tzu-Ging Lin, Kaohsiung City (TW); Chih-Chang Hung, Hsinchu (TW); Shun-Hui Yang, Taoyuan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 539 days.

(21) Appl. No.: 18/105,620

(22) Filed: Feb. 3, 2023

(65) Prior Publication Data

US 2024/0266225 A1     Aug. 8, 2024

(51) Int. Cl.
| | |
|---|---|
| *H10D 84/83* | (2025.01) |
| *H01L 21/762* | (2006.01) |
| *H10D 84/01* | (2025.01) |
| *H10D 84/03* | (2025.01) |

(52) U.S. Cl.
CPC ..... *H10D 84/038* (2025.01); *H01L 21/76224* (2013.01); *H10D 84/0151* (2025.01); *H10D 84/83* (2025.01)

(58) Field of Classification Search
CPC .......... H01L 21/76224; H10D 84/0151; H10D 84/0188; H10D 30/6735; H10D 30/014; H10D 30/43; H10D 30/6757; H10D 84/038; H10D 84/83
See application file for complete search history.

(56) References Cited

U.S. PATENT DOCUMENTS

| | | | |
|---|---|---|---|
| 9,209,247 | B2 | 12/2015 | Colinge et al. |
| 9,224,737 | B2 | 12/2015 | Chen et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |

(Continued)

*Primary Examiner* — Sonya McCall-Shepard

(74) *Attorney, Agent, or Firm* — STUDEBAKER BRACKETT PLLC

(57) ABSTRACT

In a method of manufacturing a semiconductor device, a fin structure is formed. The fin structure includes a stacked layer of first semiconductor layers and second semiconductor layers disposed over a bottom fin structure, and a hard mask layer over the stacked layer. An isolation insulating layer is formed so that the hard mask layer and the stacked layer are exposed from the isolation insulating layer. A sacrificial cladding layer is formed over at least sidewalls of the exposed hard mask layer and stacked layer. A first dielectric layer is formed, and a second dielectric layer made of a different material than the first dielectric layer is formed over the first dielectric layer. The second dielectric layer is recessed, and a third dielectric layer made of a different material than the second dielectric layer is formed on the recessed second dielectric layer, thereby forming a wall fin structure.

20 Claims, 23 Drawing Sheets

(56)         References Cited

U.S. PATENT DOCUMENTS

| | | | |
|---|---|---|---|
| 9,576,814 B2 | 2/2017 | Wu et al. | |
| 9,608,116 B2 | 3/2017 | Ching et al. | |
| 9,779,997 B2 | 10/2017 | Li et al. | |
| 2016/0005831 A1 | 1/2016 | Ando et al. | |
| 2020/0020769 A1 | 1/2020 | Peng et al. | |
| 2020/0135574 A1 | 4/2020 | Yang et al. | |
| 2021/0020524 A1 | 1/2021 | Wang et al. | |
| 2021/0057525 A1 | 2/2021 | Chiang et al. | |
| 2022/0029024 A1 * | 1/2022 | More ................. | H10D 30/6713 |

* cited by examiner

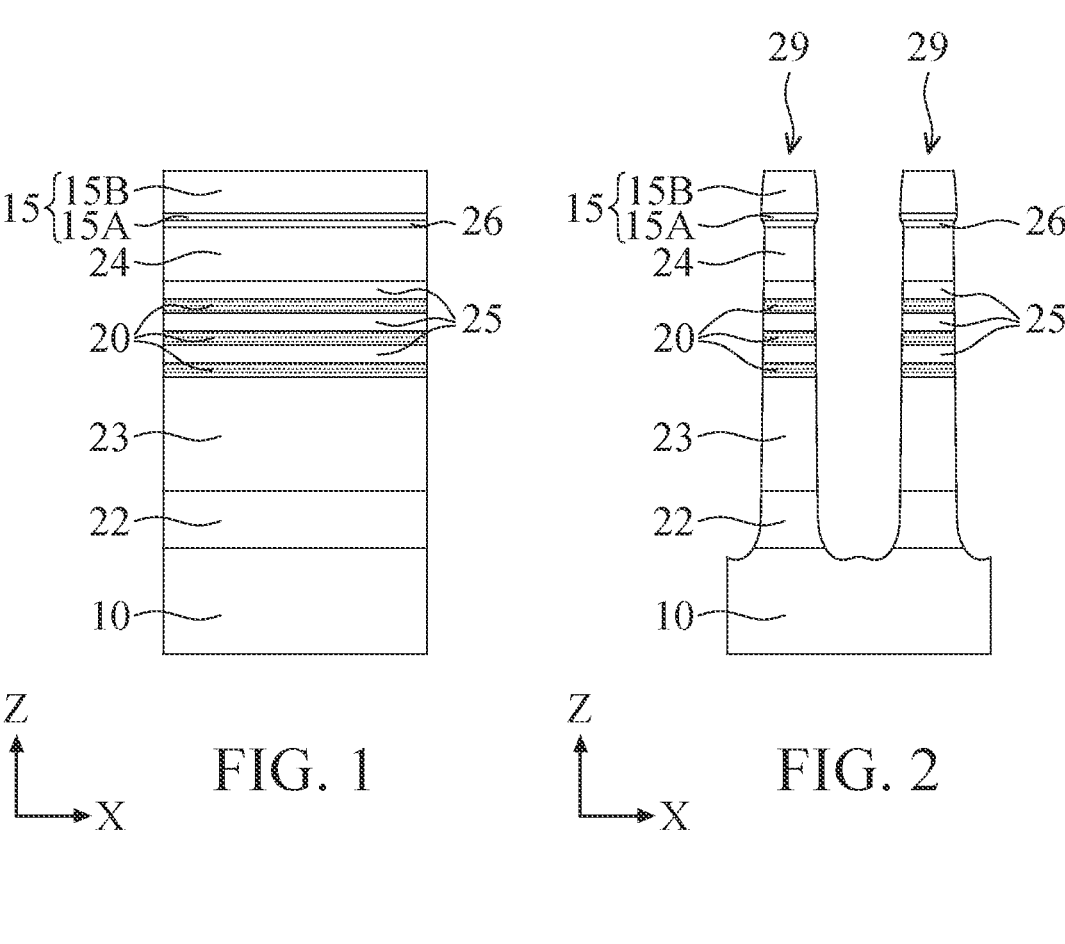
FIG. 1                                FIG. 2
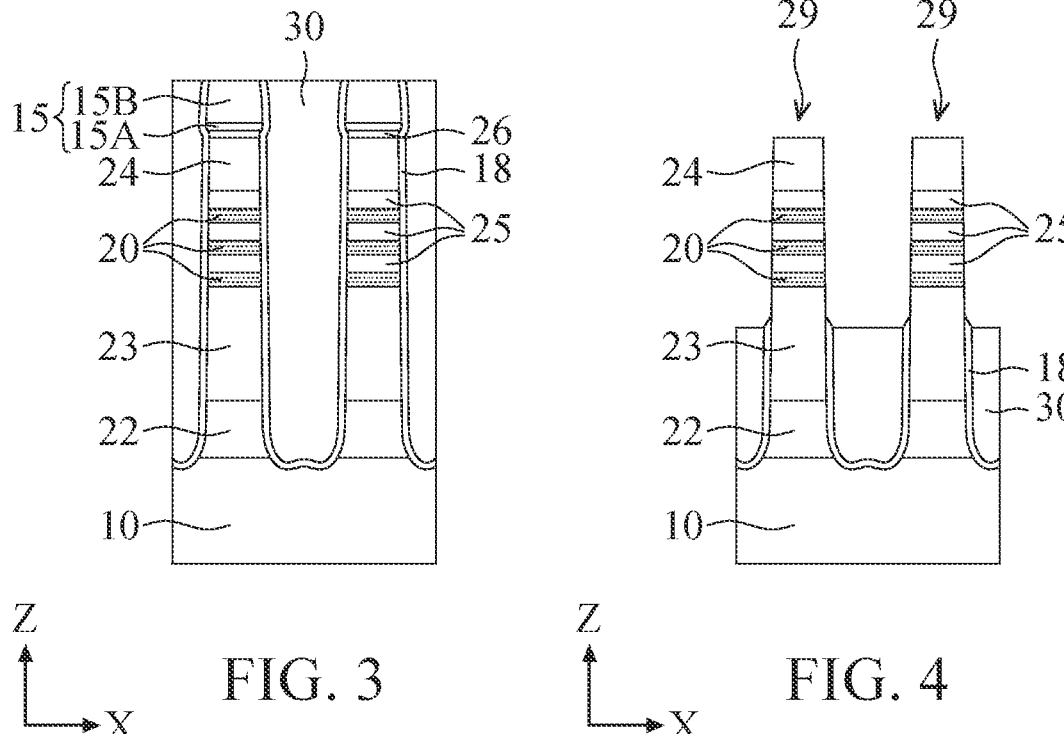
FIG. 3                                FIG. 4

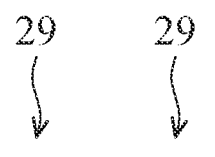
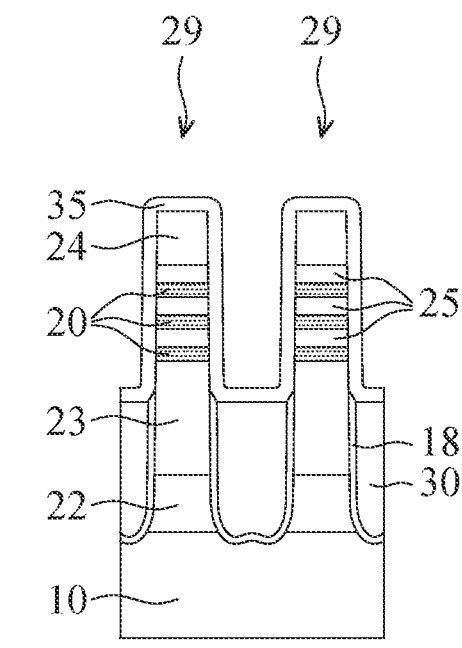
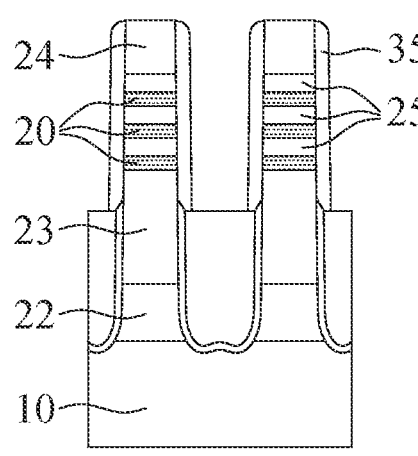
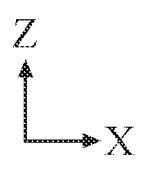
FIG. 5
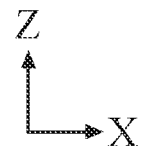
FIG. 6
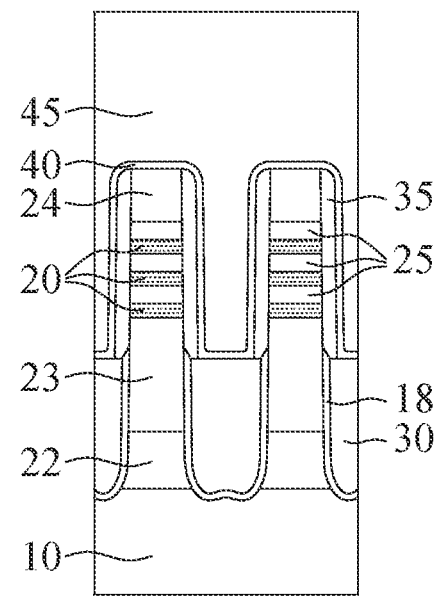
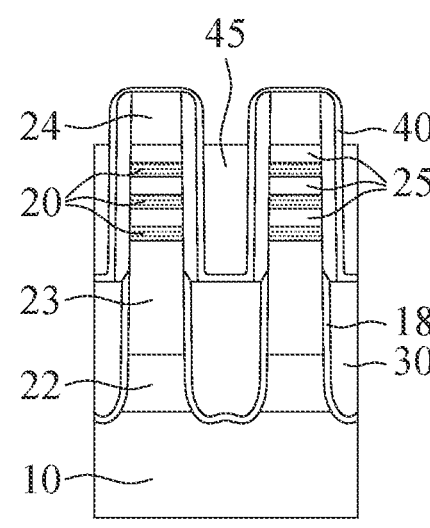
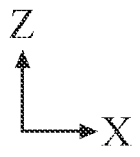
FIG. 7
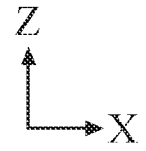
FIG. 8

3000

METHOD OF MANUFACTURING A SEMICONDUCTOR DEVICE AND A SEMICONDUCTOR DEVICE

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1, 2, 3, 4, 5, 6, 7 and 8 shows cross sectional views of various stages of manufacturing a semiconductor FET device according to an embodiment of the present disclosure.

DETAILED DESCRIPTION

Figures 9A, 9B, 9C, 9D:
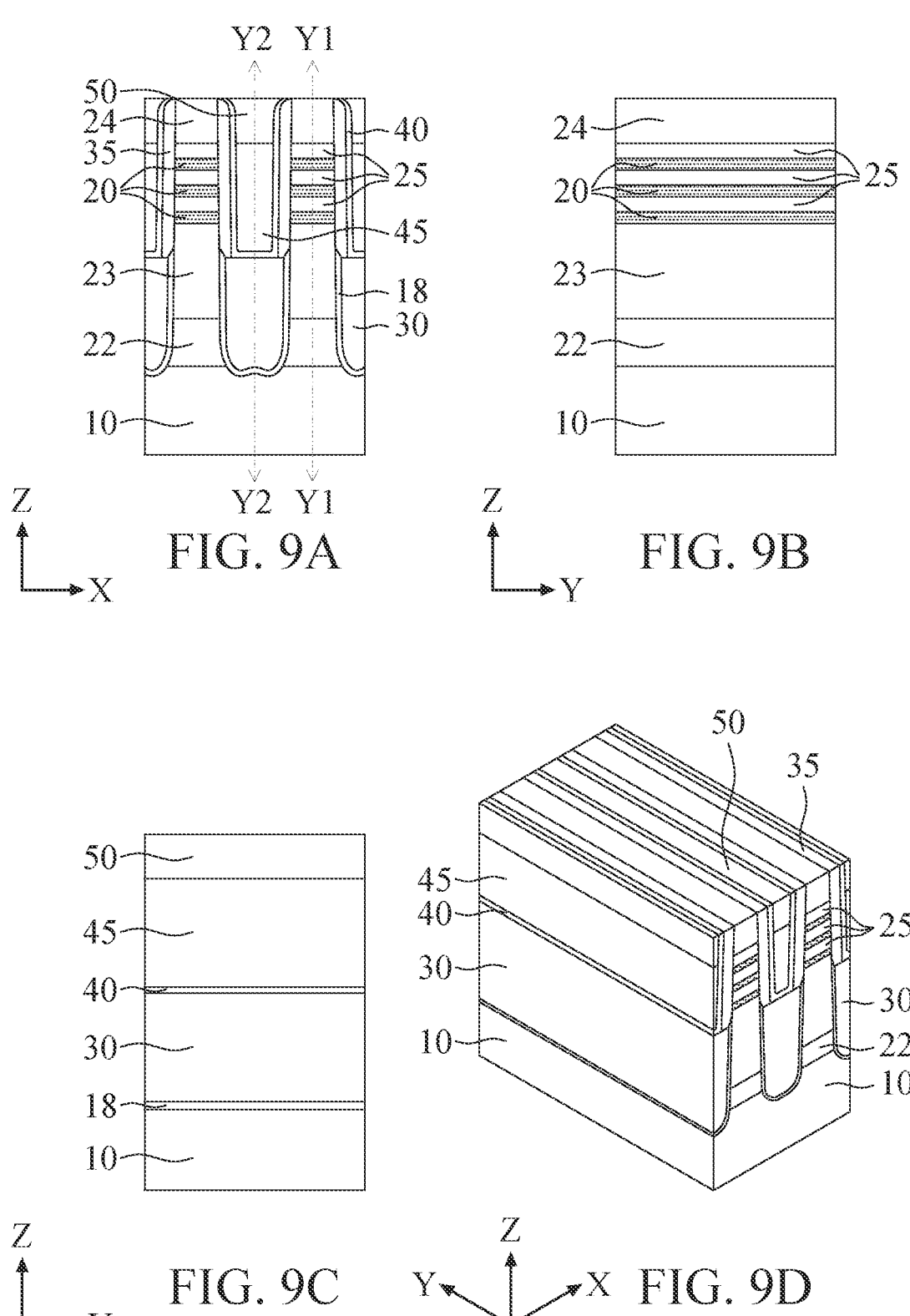
FIGS. 9A, 9B, 9C and 9D show various views of one of the various stages of manufacturing a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Fin field effect transistors (Fin FETs) are non-planar, multi-gate transistors having "fins" that perpendicularly extend from the gate and form the source and the drain of the transistor. Multiple Fin FETs may be coupled to one another to provide an integrated circuit device. One of the factors that determine device performance of a fin FET (Fin FET), or similar devices, is a capacitance between adjacent fins. An increase in the parasitic capacitance degrades circuit speed, and thereby reduce device performance In this disclosure, a source/drain refers to a source and/or a drain. It is noted that in the present disclosure, a source and a drain are interchangeably used and the structures thereof are substantially the same.

One of the factors to determine device performance of a field effect transistor (FET), such as a fin FET (FinFET) and a gate-all-around (GAA) FET, is a shape of an epitaxial source/drain structure. In particular, when a source/drain region of a FinFET or a GAA FET is recessed and then an epitaxial source/drain layer is formed therein, the etching substantially defines the shape of the epitaxial source/drain structure. Further, when two adjacent fin structures are closer to each other, the epitaxial layers undesirably merge with each other. In the present disclosure, a wall fin structure (a dielectric dummy fin structure) is employed to physically and electrically separate adjacent source/drain epitaxial layers and to define the shape of the source/drain epitaxial layer. An optimal source/drain shape can improve a FinFET's and GAA FET's Ion/Ioff current ratio, and can improve device performance.

In this disclosure, a source/drain refers to a source and/or a drain. It is noted that in the present disclosure, a source and a drain are interchangeably used and the structures thereof are substantially the same.

FIGS. 1-14C show various stages of manufacturing a semiconductor GAA FET device according to an embodiment of the present disclosure. It is understood that the manufacturing process can be used to manufacture devices other than GAA FET devices. It is understood that additional operations can be provided before, during, and after processes shown by FIGS. 1-14C, and some of the operations described below can be replaced or eliminated, for additional embodiments of the method. The order of the operations/processes may be interchangeable.

As shown in FIG. 1, a first bottom semiconductor layer 22 is epitaxially formed on a semiconductor substrate 10. In some embodiments, the semiconductor substrate 10 is a crystalline Si substrate. In other embodiments, the substrate 10 may comprise another elementary semiconductor, such as germanium; a compound semiconductor including Group IV-IV compound semiconductors such as SiC and SiGe, Group III-V compound semiconductors such as GaAs, GaP. GaN, InP, InAs, InSb, GaAsP. AlGaN, AlInAs, AlGaAs, GaInAs, GaInP, and/or GaInAsP; or combinations thereof. In one embodiment, the substrate 10 is a silicon layer of an SOI (silicon-on insulator) substrate.

The first bottom semiconductor layer 22 is made of different material than the substrate 10. When the substrate 10 is a Si substrate, the first bottom semiconductor layer 22 includes SiGe, where a Ge content is about 10 atomic % to about 60 atomic % ($S_{0.9}Ge_{0.1}$—$S_{0.4}Ge_{0.6}$) in some embodiments. The thickness of the first bottom semiconductor layer 22 is in a range from about 4 nm to about 30 nm in some embodiments, and is in a range from about 5 nm to about 25 nm in other embodiments.

Further, a second bottom semiconductor layer 23 is epitaxially formed over the first bottom semiconductor layer 22. The second bottom semiconductor layer 23 is made of different material than the first bottom semiconductor layer 22. When the first bottom semiconductor layer 22 is made of SiGe, the second bottom semiconductor layer 23 includes Si or SiGe, where a Ge content is smaller than the first bottom semiconductor layer 23 and is more than 0 atomic % to about 10 atomic % in some embodiments. The thickness of the second bottom semiconductor layer 23 is in a range from about 40 nm to about 200 nm in some embodiments, and is in a range from about 50 nm to about 150 nm in other embodiments. However, in some other embodiments, the first bottom semiconductor layer 22 not formed.

Then, first semiconductor layers 20 and second semiconductor layers 25 are alternately formed over the second bottom semiconductor layer 23. In some embodiments, the first and second bottom semiconductor layers are not formed, and the first semiconductor layers 20 and second semiconductor layers 25 are formed directly on the substrate 10.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. In one embodiment, the first semiconductor layers 20 are $S_{1-x}Ge_x$, where x is equal to or more than about 0.2 and equal to or less than about 0.6, and the second semiconductor layers 25 are Si or $Si_{1-y}Ge_y$, where y is smaller than x and equal to or less than about 0.1. In this disclosure, an "M" compound" or an "M based compound" means the majority of the compound is M.

The thickness of the first semiconductor layers 20 may be equal to or smaller than that of the second semiconductor layers 25, and is in a range from about 4 nm to about 30 nm in some embodiments, and is in a range from about 5 nm to about 20 nm in other embodiments. The thickness of the second semiconductor layers 25 is in a range from about 4 nm to about 30 nm in some embodiments, and is in a range from about 5 nm to about 20 nm in other embodiments. The thicknesses of the first semiconductor layers 20 may be the same as, or different from each other and the thicknesses of the second semiconductor layers 25 may be the same as, or different from each other. Although three first semiconductor layers 20 and three second semiconductor layers 25 are shown in FIG. 1, the numbers are not limited to three, and can be 1, 2 or more than 3, and less than 10.

Moreover, in some embodiments, a top semiconductor layer 24 is epitaxially formed over the stacked structure of the first semiconductor layers 20 and the second semiconductor layers 25. In some embodiments, the top semiconductor layers 24 are $Si_{1-z}Ge_z$, where z is equal to or more than about 0.2 and equal to or less than about 0.7. In some embodiments, z=x. The thickness of the top semiconductor layer 24 is greater than that of each of the first semiconductor layers 20 and the second semiconductor layers 25. In some embodiments, the thickness of the top semiconductor layer 24 is in a range from about 10 nm to about 100 nm, and is in a range from about 20 nm to about 50 nm in other embodiments. Further, in some embodiments, a cap semiconductor layer 26 made of a different material than the top semiconductor layer 24 is epitaxially formed on the top semiconductor layer 24. In some embodiments, the cap semiconductor layer is made of Si and has a thickness in a range from about 0.5 nm to about 10 nm. The cap semiconductor layer 26 is used to control Ge out-diffusion from the top semiconductor layer 24, and to maintain the quality of the surface of the top semiconductor layer 24 during a chemical mechanical polishing (CMP) process subsequently performed.

Further, a hard mask layer 15 including one or more layers of an insulating material or an amorphous semiconductor material (e.g., a-Si) is formed over the cap semiconductor layer 26. In some embodiments, the hard mask layer 15 includes a first hard mask layer 15A and a second hard mask layer 15B. In some embodiments, the first hard mask layer 15A is silicon oxide having a thickness in a range from 1 nm to about 20 nm and the second hard mask layer 15B is silicon nitride having a thickness in a range from about 10 nm to about 100 nm.

After the stacked layers as shown in FIG. 1 are formed, fin structures are formed by using one or more lithography and etching operations, as shown in FIG. 2. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the hard mask layer 15. By using the patterned hard mask layer as an etching mask, the stacked semiconductor layers are patterned into fin structures 29 as shown in FIG. 2. In some embodiments, the top semiconductor layer 24 and the cap semiconductor layer 26 are part of the hard mask layer and an etch stop layer for a CMP process subsequently performed.

In FIG. 2, the fin structures 29 extend in the Y direction and are arranged in the X direction. The number of the fin structures is not limited to two as shown in FIG. 2, and may be as small as one and three or more. In some embodiments, one or more dummy fin structures are formed on both sides of the fin structures 29 to improve pattern fidelity in the patterning operations.

The width of the upper portion of the fin structure 29 along the Y direction is in a range from about 5 nm to about 40 nm in some embodiments, and is in a range from about 10 nm to about 30 nm in other embodiments.

After the fin structures 29 are formed, one or more liner insulating layers 18 are formed over the fin structures 29, and an insulating material layer 30 including one or more layers of insulating material is formed over the substrate so that the fin structures 29 with the liner layer 18 are fully embedded in the insulating layer 30.

The insulating material for the liner layer 18 and the insulating layer 30 are the same or different from each other, and include one or more of silicon oxide, silicon nitride, silicon oxynitride (SiON), SiOCN, SiOC, SiCN, fluorine-doped silicate glass (FSG), or a low-k dielectric material. In some embodiments, the liner layer 18 is made of silicon oxide or silicon nitride, and the insulating layer 30 is made of silicon oxide. The insulating material is formed by LPCVD (low pressure chemical vapor deposition), plasma-enhanced CVD (PECVD), flowable CVD and/or atomic layer deposition (ALD). An anneal operation may be performed after the formation of the insulating layer 30. Then, a planarization operation, such as a chemical mechanical polishing (CMP) method and/or an etch-back method, is performed such that the upper surface of the hard mask layer 15 (the second hard mask layer 15B) is exposed from the insulating material layer 30, as shown in FIG. 3.

Then, as shown in FIG. 4, the insulating material layer is recessed to form an isolation insulating layer 30 so that the upper portions of the fin structures 29 are exposed. With this operation, the fin structures 29 are separated from each other by the isolation insulating layer 30, which is also called a shallow trench isolation (STI).

In some embodiments, the insulating material layer 30 is recessed until the upper portion of the second bottom semiconductor layer 23 is exposed. The first semiconductor layers 20 are sacrificial layers which are subsequently removed, and the second semiconductor layers 25 are subsequently formed into semiconductor wires or sheets as channel layers of a GAA FET. In some embodiments, during or after the recess etching of the insulating layer 30, the liner layer 18, the hard mask layer 15 and the cap semiconductor layer 26 are removed, thereby exposing the top semiconductor layer 24, as shown in FIG. 4.

After the isolation insulating layer 30 is formed, a sacrificial cladding layer 35 is formed over the exposed portion of the fin structures 29, as shown in FIG. 5. The sacrificial cladding layer 35 includes one or more insulating materials or semiconductor materials. In some embodiments, the sacrificial cladding layer 35 includes amorphous or poly crystalline semiconductor material (e.g., Si, SiC, SiGe or Ge). In certain embodiments, the sacrificial cladding layer 35 is amorphous SiGe, having a Ge concentration in a range from about 20 atomic % to about 40 atomic %. In some embodiments, the Ge concentration of the sacrificial cladding layer 35 is the same as or similar to (difference within ±5%) the Ge concentration of the first semiconductor layer 20. In some embodiments, the thickness of the sacrificial cladding layer 35 is in a range from about 5 nm to about 50 nm. If the thickness of the sacrificial cladding layer 35 is smaller than this range, a space for a metal gate formation is too small and some of the layers of the metal gate structure would not be properly formed. If the thickness of the sacrificial cladding layer 35 is larger than this range, electrical separation between adjacent fin structures would be insufficient. In some embodiments, before forming the sacrificial cladding layer 35, a thin semiconductor layer is formed over the exposed portion of the fin structures 29. In some embodiments, the thin semiconductor layer is non-doped Si. In some embodiments, the non-doped Si is crystalline Si. In some embodiments, the thickness of the thin semiconductor layer is in a range from about 2 nm to about 3 nm. The sacrificial cladding layer 35 is conformally formed by CVD or ALD in some embodiments. The deposition temperature of the sacrificial cladding layer 35 is less than or similar to the deposition temperature of the first semiconductor layers 20, in some embodiments. In some embodiments, the deposition temperature of the sacrificial cladding layer 35 is in a range from about 500° C. to 650° C. The source gas includes a mixture of $SiH_4$, $GeH_4$, and HCl with $H_2$ or $N_2$ as a carrier gas. The sacrificial cladding layer 35 controls stress in the isolation area.

Then, as shown in FIG. 6, one or more etch-back operations are performed to remove horizontal portions of the sacrificial cladding layer 35 so as to expose the upper surface of the top semiconductor layer 24 and the upper surface of the isolation insulating layer 30. In some embodiments, the etch-back operation includes a deposition-etching process. In some embodiments, the plasma generated from $CH_4$ is used for the deposition phase, and the plasma generated from HBr and He is used for the etching phase, which are repeated. In some embodiments, after the deposition-etching operation, a wet cleaning process to remove residuals is performed.

Subsequently, a first dielectric layer 40 is formed over the fin structures, and a second dielectric layer 45 is formed over the first dielectric layer 40 such that the fin structures are fully embedded in the second dielectric layer 45, as shown in FIG. 7. The first dielectric layer 40 includes one or more layers of insulating materials such as silicon oxide, silicon oxynitride, silicon nitride, SiOC, SiCN or SiOCN, formed by LPCVD (low pressure chemical vapor deposition), plasma-CVD or atomic layer deposition (ALD), or any other suitable film formation method. In certain embodiments, SiCN or SiOCN is used as the first dielectric layer 40. In some embodiments, as shown in FIG. 7, the first dielectric layer 40 is conformally formed over the fin structures such that a space is formed between adjacent fin structures. The thickness of the first dielectric layer 40 is in a range of about 2.5 nm to about 20 nm in some embodiments, and is in a range from about 5 nm to about 10 nm in other embodiments.

The material of the second dielectric layer 45 is different from the material of the first dielectric layer 40. In some embodiments, the second dielectric layer 45 includes one or more layers of insulating materials such as silicon oxide, silicon oxynitride, silicon nitride, SiOC, SiCN or SiOCN formed by LPCVD, plasma-CVD or ALD, or any other suitable film formation method. In some embodiments, the second dielectric layer 45 is made of silicon nitride or silicon oxide. In some embodiments, the second dielectric layer 45 includes a first layer and a second layer. The first layer is silicon oxide formed by, for example, a flowable CVD process followed by a thermal annealing process at 400° C. to 800° C. in an inert gas ambient. The second layer is also silicon oxide formed by a plasma CVD process. The thickness of the second dielectric layer 45 is in a range of about 60 nm to about 500 nm in some embodiments. As shown in FIG. 7, the second dielectric layer 45 fully fills the space between adjacent fin structures, in some embodiments. In other embodiments, a void is formed in the bottom part of the space. In some embodiments, one or more additional dielectric layers are formed between the first dielectric layer 40 and the second dielectric layer 45.

After the second dielectric layer 45 is formed, a planarization operation, such as an etch-back process or a chemical mechanical polishing (CMP) process, is performed to planarize the second dielectric layer 45 and to expose the upper surface of the top semiconductor layer 24. In some embodiments, the top semiconductor layer 24 is slightly etched by about 5 nm to about 10 nm. Further, one or more additional etch-back operations are performed to recess the second dielectric layer 45 as shown in FIG. 8. The second dielectric layer 45 is recessed to a level substantially equal (within ±5 nm) to the interface between the top semiconductor layer 24 and the uppermost one of the second semiconductor layers 25. In some embodiments, subsequently, the first dielectric layer 40 is further trimmed (etched) to expose a part of the sacrificial cladding layer 35.

Next, as shown in FIGS. 9A-9D, a third dielectric layer 50 is formed on the recessed second dielectric layer 45. FIG. 9A is a cross sectional view along the X direction, FIG. 9B is a cross sectional view along the Y direction corresponding to line Y1-Y1 of FIG. 9A, FIG. 9C is a cross sectional view along the Y direction corresponding to line Y2-Y2 of FIG. 9A, and FIG. 9D is a isometric view.

The material of the third dielectric layer 50 is different from the materials of the first dielectric layer 40 and the second dielectric layer 45. In some embodiments, the third dielectric layer 45 includes a material having a lower etching rate than the second dielectric layer against a polysilicon or an amorphous SiGe etching. In some embodiments, the third dielectric layer 50 includes a high-k dielectric material. In some embodiments, the third dielectric layer 50 includes a dielectric material having a higher dielectric constant (k) than the second dielectric layer 45 and/or the first dielectric layer 40.

In some embodiments, the third dielectric layer 50 includes one or more of non-doped hafnium oxide (e.g., $HfO_x$, $0 < x \leq 2$), hafnium oxide doped with one or more other elements (e.g., HfSiO, HfSiON, HfTaO, HfTiO or HfZrO), zirconium oxide, aluminum oxide, titanium oxide, and a hafnium dioxide-alumina ($HfO_2$—$Al_2O_3$) alloy. In certain embodiments, hafnium oxide ($HfO_x$) is used as the third dielectric layer 50. The third dielectric layer 50 can be formed by LPCVD, plasma-CVD or ALD, or any other suitable film formation method. As shown in FIG. 9A, the third dielectric layer 50 fully fills the space between adjacent fin structures. After the third dielectric layer 50 is formed to fully cover the fin structures, a planarization operation, such as an etch-back process or a CMP process, is performed to planarize the upper surface of the third dielectric layer 40 to expose the upper surface of the top semiconductor layer 24, as shown in FIGS. 9A-9D. In some embodiments, the thickness of the third dielectric layer 50 remaining on the top semiconductor layer 24 is in a range from about 5 nm to about 100 nm, the width of the third dielectric layer 50 at the top thereof is in a range from about 10 nm to about 80 nm, depending on device and/or process requirements. Accordingly, a wall fin structure is formed by layers 40, 45 and 50 between adjacent fin structures. After the wall fin structure is formed, an annealing operation at a temperature of about 800° C. to about 1000° C. is performed for about 10 sec to about 60 sec, in some embodiments.

Figures 10A, 10B, 10C, 11A, 11B, 11C:
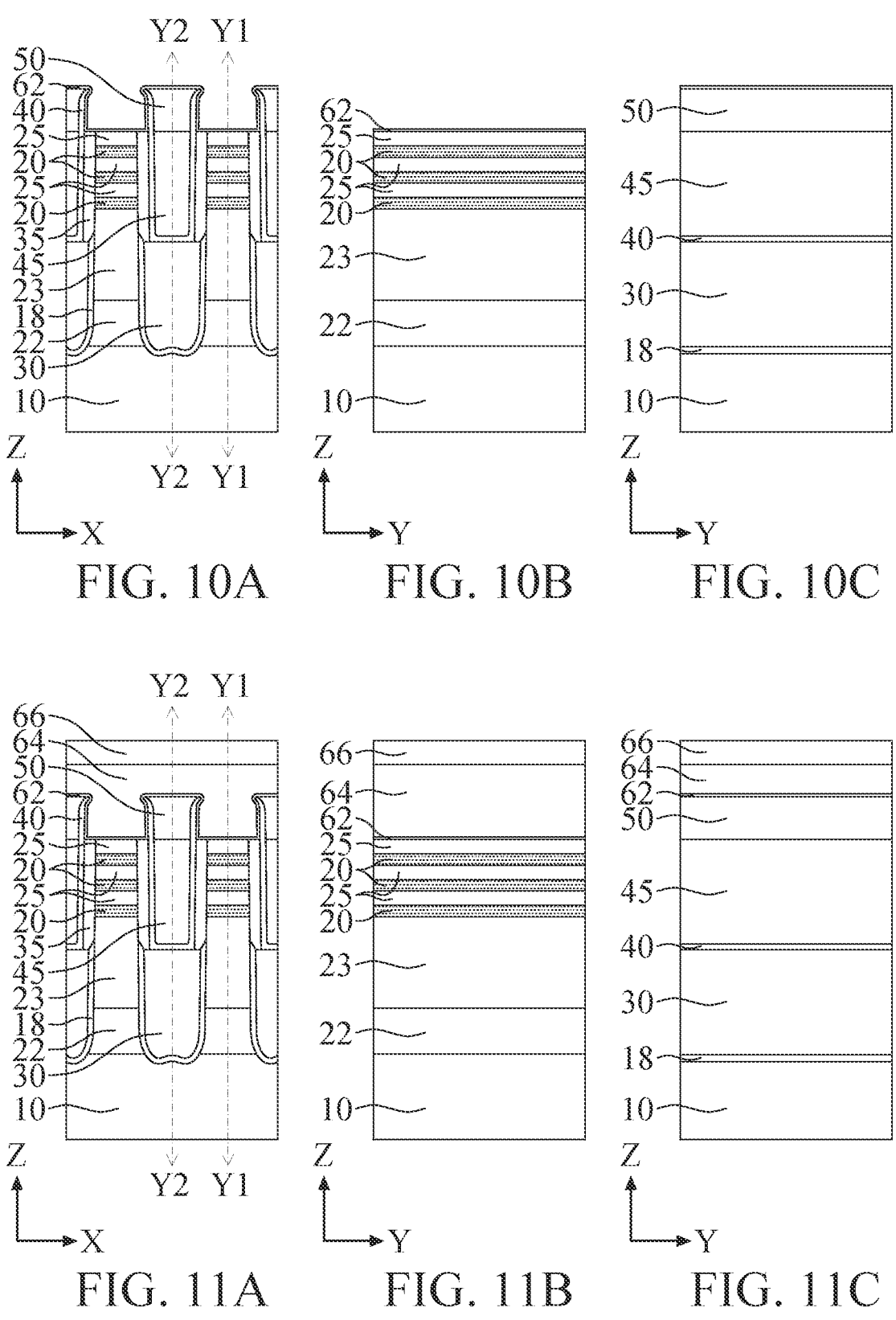
FIGS. 10A, 10B and 10C show various views of one of the various stages of manufacturing a semiconductor FET device according to an embodiment of the present disclosure.
FIGS. 11A, 11B and 11C show various views of one of the various stages of manufacturing a semiconductor FET device according to an embodiment of the present disclosure.

Then, as shown in FIGS. 10A-10C, the top semiconductor layer 24 is removed by one or more dry or wet etching operations. In FIGS. 10A-10C to 21A-21C, the "B" figures are cross sectional views along the Y direction corresponding to line Y1-Y1 of the "A" figures, and the "C" figures are cross sectional view along the Y direction corresponding to line Y2-Y2 of the "A" figures. As shown in FIG. 10A, a groove having sidewalls formed by the cladding layers 35 is formed. After the top semiconductor layer 24 is removed, a sacrificial gate dielectric layer 62 is formed on the uppermost one of the second semiconductor layers 25, the sidewalls of the first dielectric layer, and on the third dielectric layer 50 as shown in FIGS. 10A-10C. The sacrificial gate dielectric layer 62 includes one or more layers of insulating material, such as a silicon oxide-based material. In one embodiment, silicon oxide formed by CVD is used. The thickness of the sacrificial gate dielectric layer 62 is in a range from about 1 nm to about 5 nm in some embodiments.

Further, as shown in FIGS. 11A-11C, a sacrificial (dummy) gate electrode layer 64 is formed, and a hard mask layer 66 is formed on the sacrificial gate electrode layer 64. The sacrificial gate electrode layer 64 is blanket deposited on the sacrificial gate dielectric layer 62 and over the third dielectric layer 50, such that the third dielectric layer 50 is fully embedded in the sacrificial gate electrode layer 64. The sacrificial gate electrode layer 64 includes silicon such as polycrystalline silicon or amorphous silicon. The thickness of the sacrificial gate electrode layer 64 is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, the hard mask layer 66 is formed over the sacrificial gate electrode layer. The hard mask layer 66 includes one or more layers of silicon nitride layer or silicon oxide.

Figures 12A, 12B, 12C, 13A, 13B, 13C:
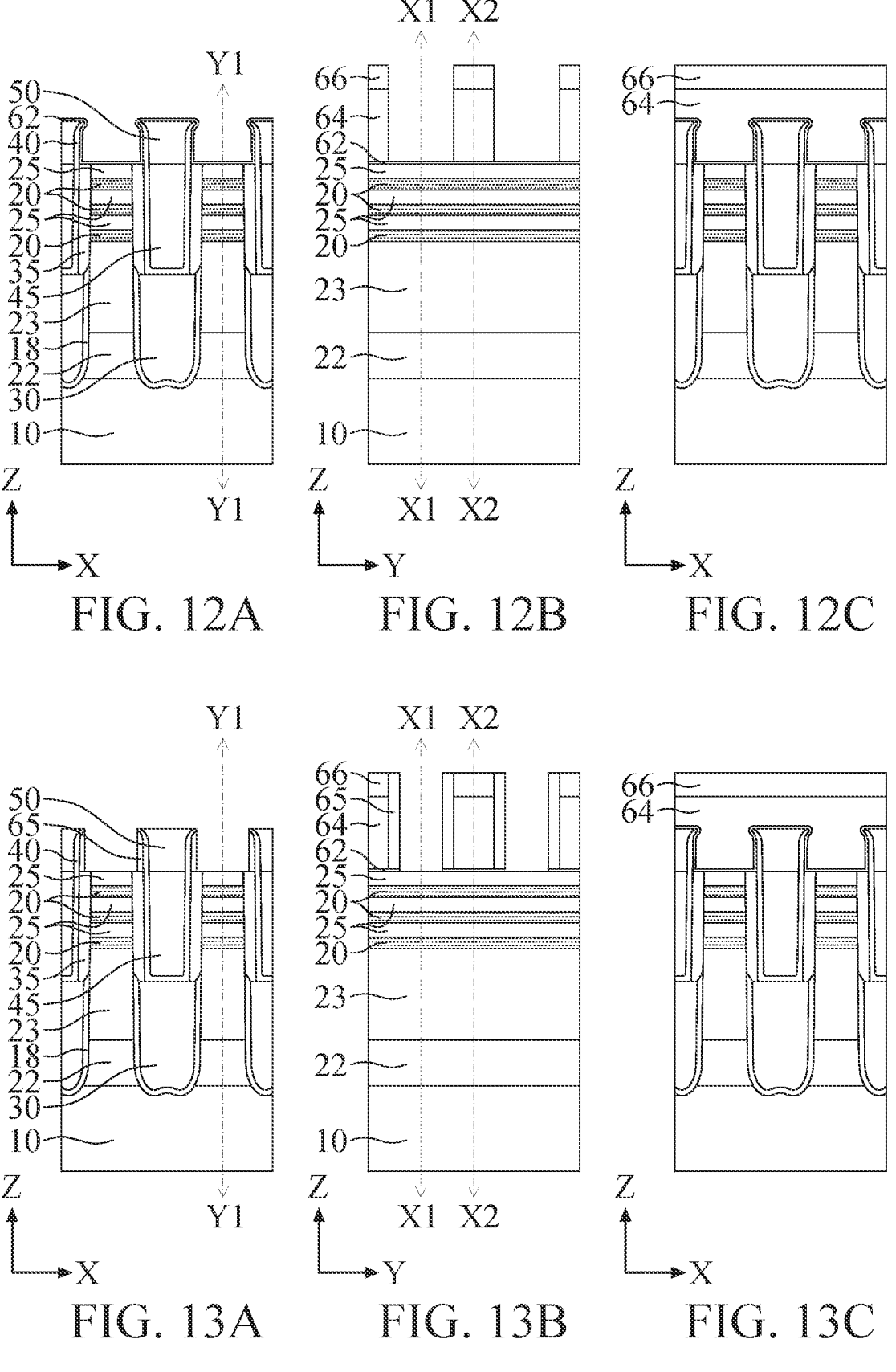
FIGS. 12A, 12B and 12C show various views of one of the various stages of manufacturing a semiconductor FET device according to an embodiment of the present disclosure.
FIGS. 13A, 13B, 13C and 13D show various views of one of the various stages of manufacturing a semiconductor FET device according to an embodiment of the present disclosure.

Next, a patterning operation is performed on the hard mask layer 66 and the sacrificial gate electrode layer 64 is patterned into sacrificial gate electrodes, as shown in FIGS. 12A-12C. In some embodiments, the width of the sacrificial gate electrode layer 64 is in a range from about 5 nm to about 30 nm and is in a range from about 10 nm to about 20 nm. Two or more sacrificial gate electrodes are arranged in the Y direction in some embodiments. In certain embodiments, one or more dummy sacrificial gate electrodes are formed on both sides of the sacrificial gate electrodes to improve pattern fidelity.

Figure 13D:
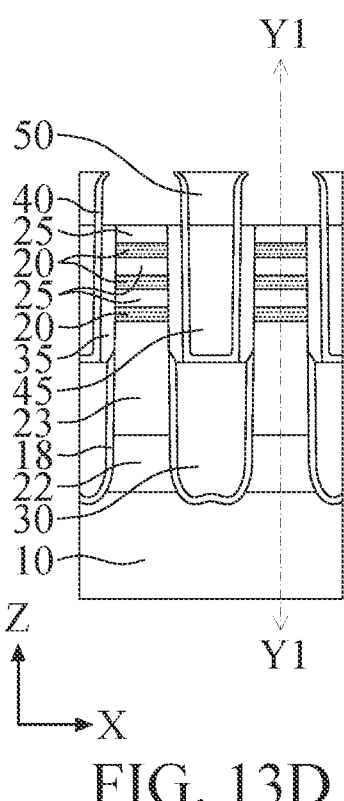

Further, sidewall spacers 65 are formed over the sacrificial gate electrodes 64, as shown in FIGS. 13A-13C. One or more insulating layers are deposited in a conformal manner to have substantially equal thicknesses on vertical surfaces, such as the sidewalls, horizontal surfaces, and the top of the sacrificial gate electrode and the sidewalls by the first dielectric layer 40, respectively. Then, by using anisotropic etching, the sidewall spacers 65 are formed. In some embodiments, the sidewall spacer has a thickness in a range from about 3 nm to about 20 nm. The sidewall spacers 65 include one or more of silicon nitride, SiON, SiCN, SiCO, SiOCN or any other suitable dielectric material. In some embodiments, since the height of the third dielectric layer 50 is much smaller than the height of the sacrificial gate electrode layer 64 with the hard mask layer, the thickness of the sidewall spacers on sidewalls of the first dielectric layer which is on the third dielectric layer 50 is smaller than the thickness of the sidewall spacers on the sacrificial gate electrode layer 64, or no sidewall spacer is formed on sidewalls of the first dielectric layer which is on the third dielectric layer 50 as shown in FIG. 13D.

Figures 14A, 14B, 14C:
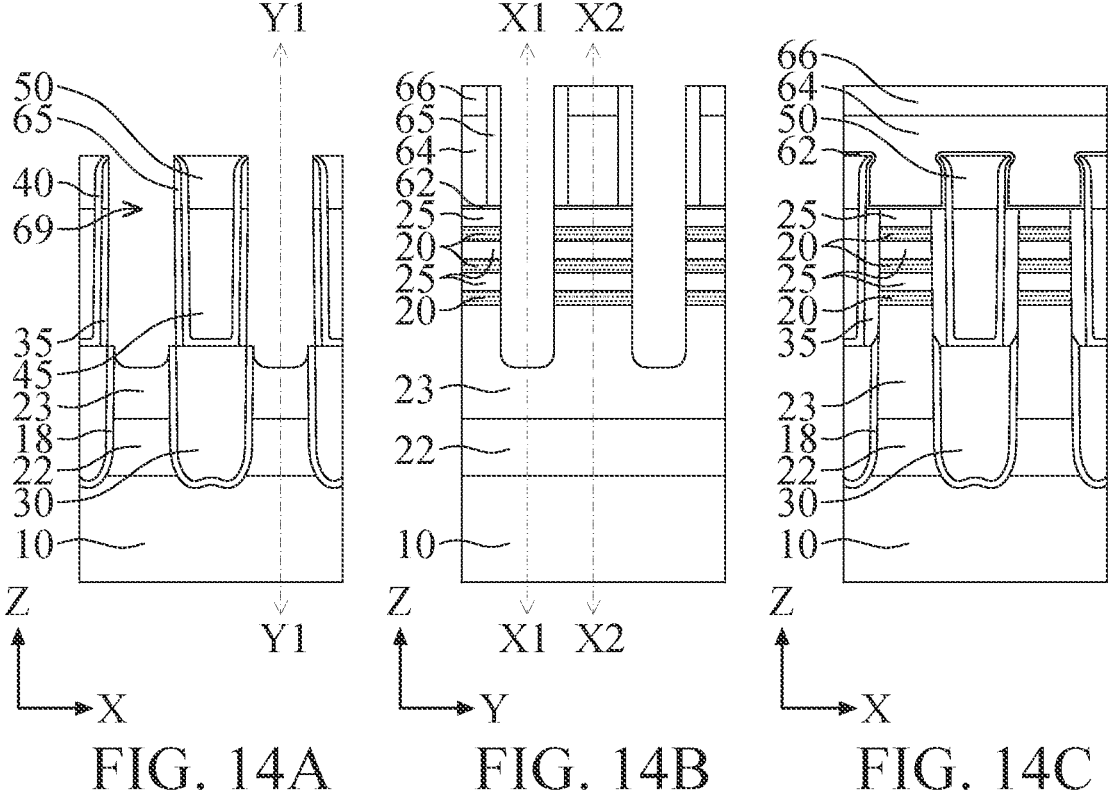
FIGS. 14A, 14B and 14C show various views of one of the various stages of manufacturing a semiconductor FET device according to an embodiment of the present disclosure.

Then, the stacked structure of the first semiconductor layers 20 and the second semiconductor layer 25 is etched down at the source/drain regions, by using one or more etching operations, thereby forming a source/drain space 69, as shown in FIGS. 14A-14B. In some embodiments, the second bottom semiconductor layer 23 is also partially etched. In some embodiments, during the etching, the sacrificial cladding layer 35 is partially or fully removed. In some embodiments, when no or thin sidewall spacer is formed on sidewalls of the first dielectric layer which is on the third dielectric layer 50, the sacrificial cladding layer 35 is also removed during the etching to form the source/drain space 69.

Figure 15:
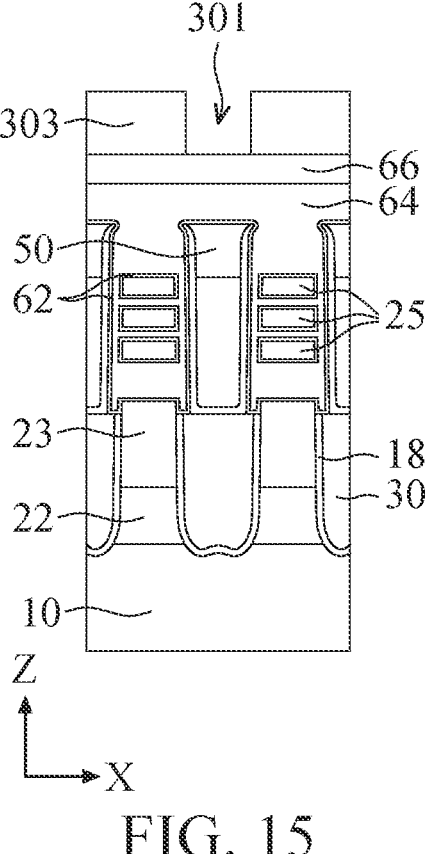
FIG. 15 illustrates a deposition and patterning process to form an opening in the hard mask layer according to an embodiment of the present disclosure.

FIG. 15 illustrates a deposition and patterning process to form an opening 301 through a photo resist layer 303 deposited over the hard mask layer 66. The photo resist layer 303 may be deposited using any suitable deposition or coating process, may be formed to any suitable thickness, and may be patterned using any suitable photo lithography method to form the openings 301 through the photo resist layer 303 and to expose surfaces of the hard mask layer 66 in areas overlying the sacrificial gate electrode layer 64 between adjacent fin structures. Prior to the operations in FIG. 15, the sacrificial gate electrode layer 64 is removed and then replaced by a metal gate electrode 64. In some embodiments, the gate electrode includes poly Si. In some embodiments, the gate electrode includes metal based material. The sacrificial gate electrode layer 64 is removed by one or more dry or wet etching operations, for example.

Figure 16:
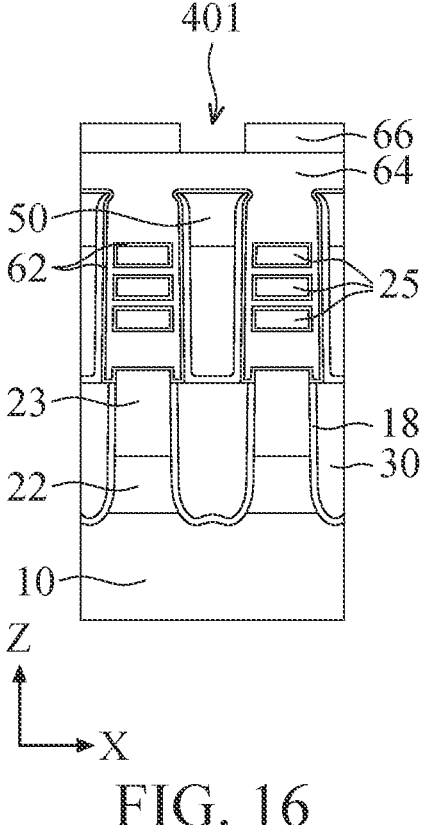
FIG. 16 illustrates a transferring of the pattern of the photo resist layer into the hard mask layer to form a pattern of openings through the hard mask layer according to an embodiment of the present disclosure.

FIG. 16 illustrates a transferring of the pattern of the photo resist layer 303 into the hard mask layer 66 to form a pattern of openings 401 through the hard mask layer 66. In some embodiments, an etchant used for etching the hard mask layer 66 includes reactant gasses having a greater etching selectivity for the material used to form the hard mask layer 66 than the gate electrode layer material used to form the gate electrode 64. As such, the gate electrode 64 serves as a contact etch stop layer and areas of the gate electrode 64 overlying the third dielectric layer 50 are exposed through the openings 401. In some embodiments, the etching process may be performed using, for example, carbon-and-fluorine-containing gases such as $CF_4$, $CH_2F_2$, $CHF_3$, or the like.

Figure 17:
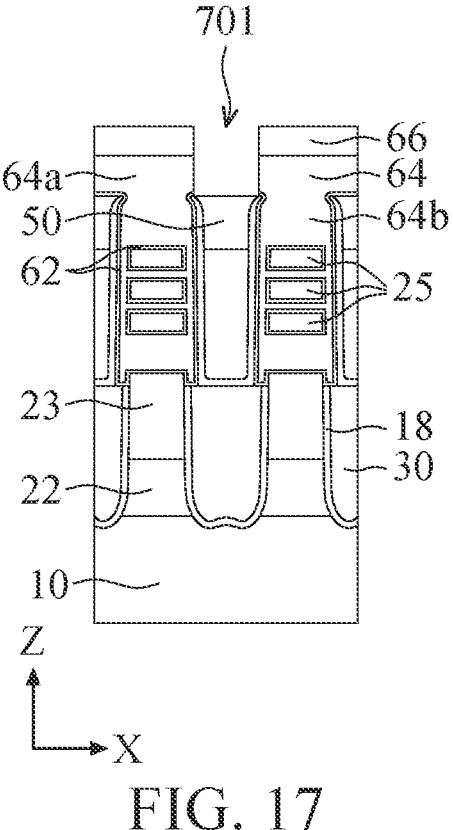
FIG. 17 illustrates a cut-metal gate (CMG) etching process according to an embodiment of the present disclosure.

FIG. 17 illustrates a cut-metal gate (CMG) etching process performed to remove the exposed portions of the gate electrode 64 and portions sacrificial gate dielectric layer 62 in order to form CMG opening 701. This CMG etching process separates the gate electrode 64 into two gate sections, effectively "cutting" the gate electrode 64. According to some embodiments, the CMG etching process comprises a dry etching process using chlorine-containing or fluorine-containing gases, such as $Cl_2$, $NF_3$, $SiCl_4$, $BCl_3$, $O_2$, $N_2$, $H_2$, Ar, combinations thereof or the like. However, any suitable dry etching gases may be used for the CMG etching process.

During the CMG etching process, a residual byproduct material may be formed as a byproduct of reactions between the materials of the gate dielectric layer 62, the materials of the gate electrode 64, hard mask layer 66 and the reactant gases during the CMG etching process. Once the CMG openings 701 have been formed, a removal process is performed to remove any residual byproduct in some embodiments. For example, $HF/NH_3$ gas may be used to remove the material. The $HF/NH_3$ gas has low selectivity to metal and may be adjusted to have different selectivity to SiN by adjusting pressures and temperatures during removal of the polymer byproduct.

Once the CMG polymer byproduct has been removed, a wet clean is performed to ensure a clean surface of the CMG opening 701 for further processing in some embodiments. According to some embodiments, a solution such as an SC-1 or SC-2 cleaning solution may be utilized for the wet clean process. Although, other solutions such as a mixture of $H_2SO_4$ and $H_2O_2$, or a solution of hydrogen fluoride (HF), may also be utilized. However, any suitable solution or any suitable process may be used for the wet clean process.

Figure 18:
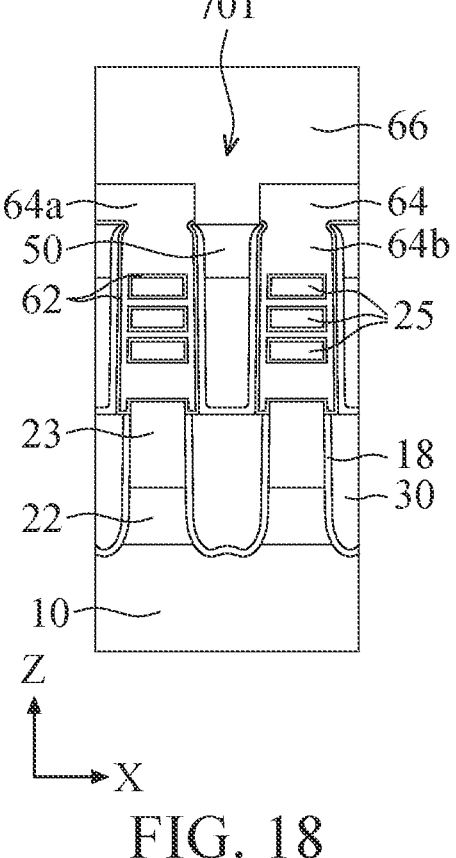
FIG. 18 illustrates a deposition of a CMG refill material including the material of the hard mask layer over the CMG opening according to an embodiment of the present disclosure.

FIG. 18 illustrates a deposition of a CMG refill material including the material of the hard mask layer 66 over the CMG opening 701. The CMG fill material includes one or more layers of silicon nitride layer or silicon oxide depending on the material in the hard mask layer 66. The CMG refill material is deposited using a deposition process such as PECVD, ALD, CVD, or the like. In some embodiments, the CMG refill material is the same as the material of the hard mask layer 66, and in other embodiments, a different dielectric material than the hard mask layer 66 is used as the CMG refill material.

A continuous poly on diffusion edge (CPODE) pattern is used to form a trench by removing a dummy structure, e.g., gate electrode 64, and a portion of a substrate, e.g., semiconductor substrate 10, under the dummy structure. In some embodiments. CPODE layout pattern is used to indicate that gate layout pattern is a dummy gate layout patter. Other configurations or quantities of patterns in the CPODE layout pattern are within the scope of the present disclosure.

Figure 19:
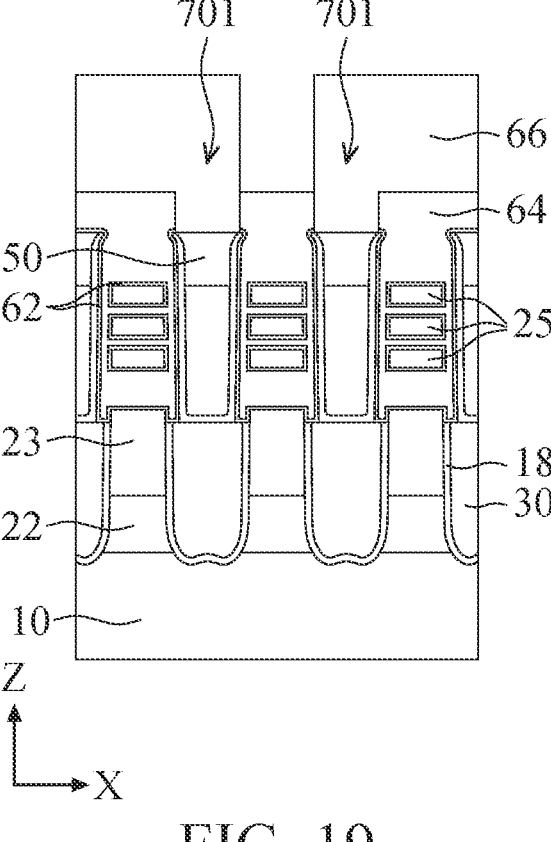
FIG. 19 illustrates a continuous poly on oxide definition edge (CPODE) process using the semiconductor device fabricated in FIG. 18 according to an embodiment of the present disclosure.

FIG. 19 illustrates a CPODE process using the semiconductor device fabricated in FIG. 18. For the sake of explanation, FIG. 19 illustrates additional fin structures 29 and insulating regions 30, and other features of the semiconductor device in FIG. 18. As illustrated, portions of the hard mask layer 66 are etched to expose the underlying gate electrode 64 between adjacent CMG openings 701 over the fin structures. In some embodiments, the etching process may be performed using, for example, carbon-and-fluorine-containing gases such as $CF_4$, $CH_2F_2$, $CHF_3$, or the like.

Figure 20:
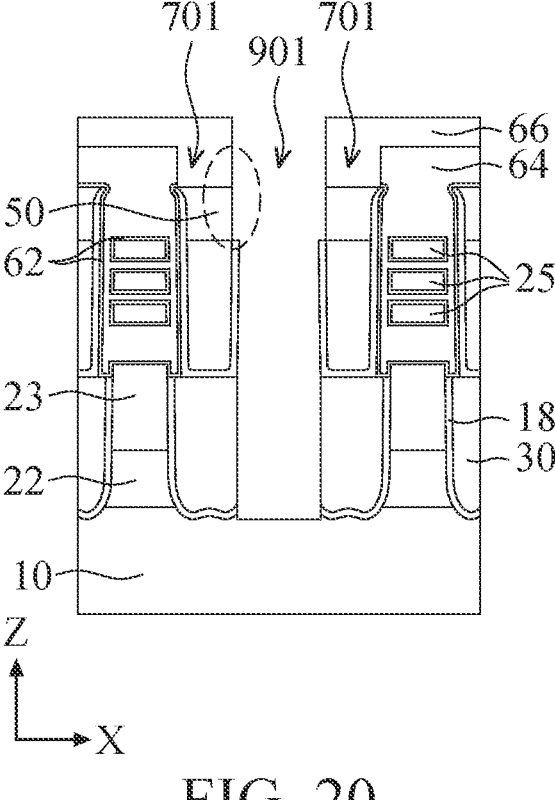
FIG. 20 illustrates an etching process of the gate electrode and the underlying first semiconductor layers and second semiconductor layers according to an embodiment of the present disclosure.

FIG. 20 illustrates an etching process of the gate electrode 64 and the underlying fin structures including the first semiconductor layers 20 and second semiconductor layers 25. The etching process is performed using one or more dry and/or wet etching operations, as shown in FIG. 20. The gate electrode 64, the underlying first semiconductor layers 20 and second semiconductor layers 25, and other structures below the CMG opening 701 may be patterned by any suitable method. In some embodiments, the etching operations include etching of metal gate electrode layers followed by etching of semiconductor layers. The etching process results in the removal of a fin structure 29 and in the formation of a trench 901.

Figure 21:
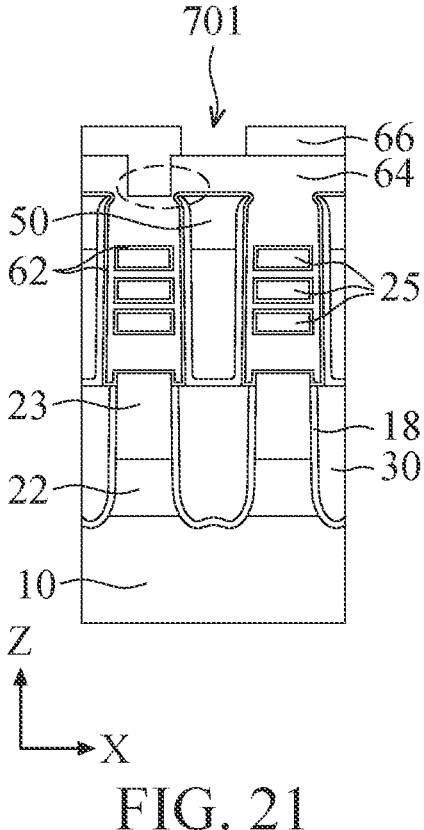
FIG. 21 illustrates an overlay shift.

In some instances, during the manufacturing process discussed above in FIG. 18, there may be an overlay shift in the CMG process. For example, referring to FIG. 16, the overlay shift is resultant from a misalignment between the CMG opening 701 and the third dielectric layer 50. FIG. 21 illustrates the overlay shift within the dashed oval. The misalignment between the CMG opening 701 and the third dielectric layer 50 may be due to a shift in the formation of the CMG opening 701 during the CMG etching process illustrated in FIG. 17. One reason for the overlay shift is due to a narrower dimension of the third dielectric layer 50 and the CMG opening 701 may not correctly land on the third dielectric layer 50. If there is misalignment between the CMG opening 701 and the third dielectric layer 50, then the trench 901 is incorrectly formed. For instance, the sidewall portion indicated by the dashed oval in FIG. 20 is misaligned.

One solution to reduce the overlay shift is tighter overlay control to ensure near-zero misalignment. Another solution is to increase the CD (width) of the CMG opening 701 to increase the margin, and thereby the alignment between the CMG opening 701 and the third dielectric layer 50. However, the manufacturing process to obtain tighter overlay control to ensure near-zero misalignment between the CMG opening 701 and the third dielectric layer 50 is time-consuming and costly. An increased (wider) CMG opening 701 substantially reduces the work function of the gate electrode 64.

Embodiments of the disclosure are directed to increasing the CD (width) of the third dielectric layer 50 to improve the alignment between the CMG opening 701 and the third dielectric layer 50. Embodiments of the disclosure are also directed to forming a recess in the third dielectric layer 50 to improve a contact between the hard mask layer 66 and the third dielectric layer 50.

Figure 22A:
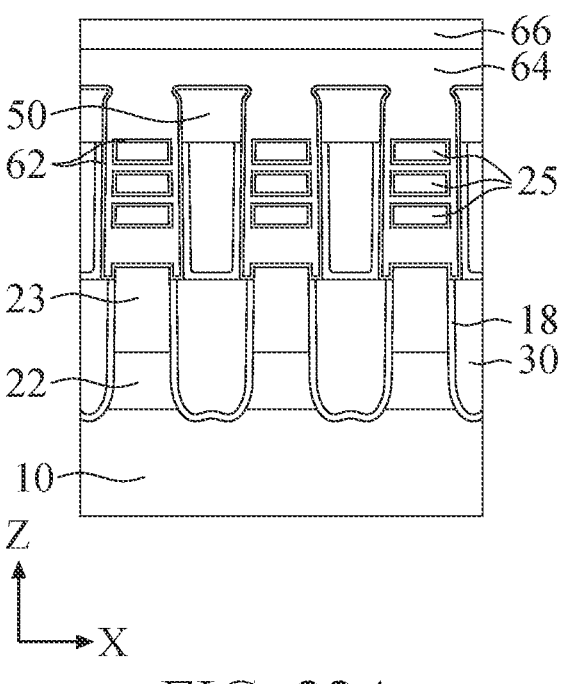
FIGS. 22A, 22B, 22C, 22D, and 22E illustrate various views of the various stages of forming the semiconductor device having a wider third dielectric layer according to an embodiment of the present disclosure.
Figure 22B:
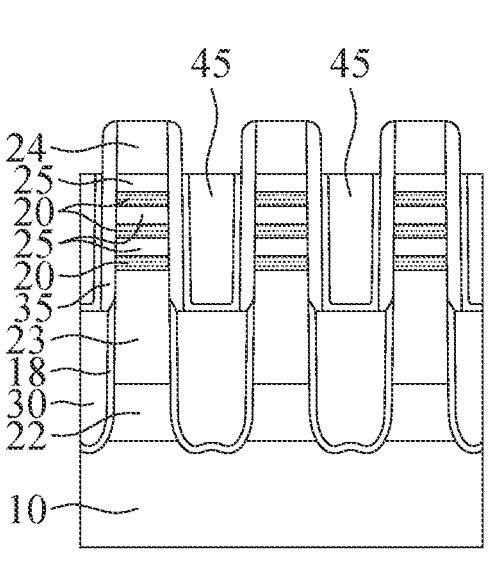

FIG. 22A illustrates the semiconductor device formed having a wider third dielectric layer 50 compared to the width of the third dielectric layer 50 in FIG. 14C. The wider third dielectric layer 50 can be obtained by removing the first dielectric layer 40 (FIG. 8) above the second dielectric layer 45 prior to forming the third dielectric layer 50 as shown in FIGS. 9A-9C. As illustrated in FIG. 22B, with reference to FIGS. 8 and 22A, the first dielectric layer 40 above the second dielectric layer 45 and in the recess formed by removing the second dielectric layer 45 is etched to create a wider recess. The etching exposes the sidewalls of the sacrificial cladding layer 35.

Figure 22C:
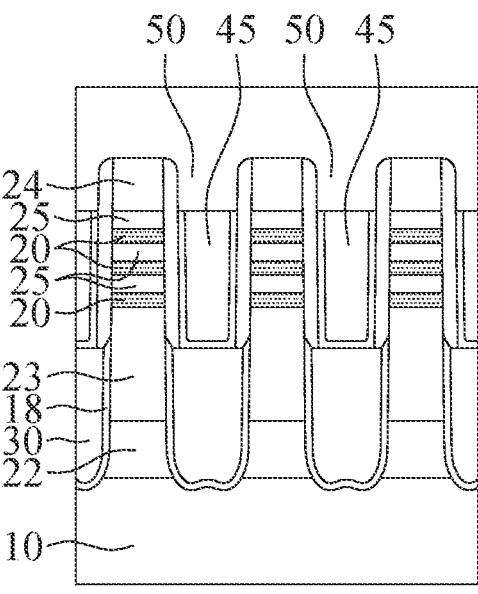
Figure 22D:
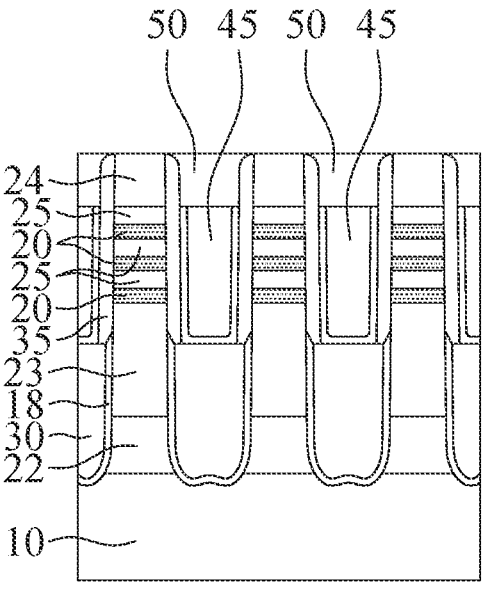

The third dielectric layer 50 is formed in the widened recess on the second dielectric layer 45 and over the fin structures, as illustrated in FIG. 22C. The third dielectric layer 50 can be formed by LPCVD, plasma-CVD or ALD, or any other suitable film formation method. After the third dielectric layer 50 is formed to fully cover the fin structures, a planarization operation, such as an etch-back process or a CMP process, is performed to planarize the upper surface of the third dielectric layer 50 to expose the upper surface of the fins structures, as illustrated in FIG. 22D.

Figure 22E:
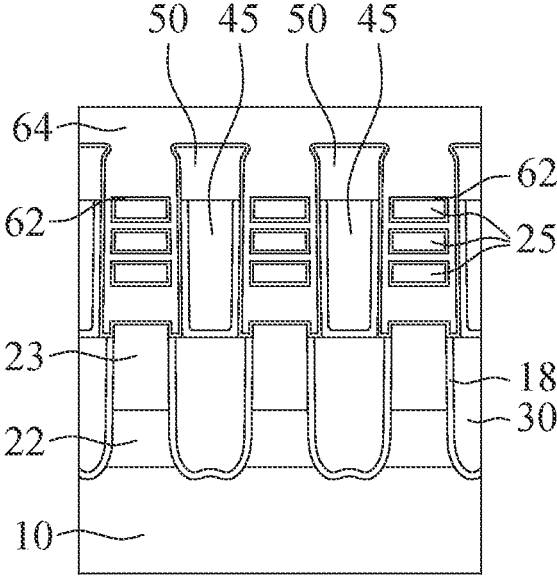

Then, as shown in FIG. 22E, the top semiconductor layer 24 and cladding layers 35 are removed by one or more dry or wet etching operations, and grooves having sidewalls formed by the third dielectric layer 50 are formed.

After the top semiconductor layer 24 and cladding layers 35 are removed, a sacrificial gate dielectric layer 62 is formed on the uppermost one of the second semiconductor layers 25 and the sidewalls of the third dielectric layer 50 as shown in FIG. 22E. The sacrificial gate dielectric layer 62 includes one or more layers of insulating material, such as a silicon oxide-based material. In one embodiment, silicon oxide formed by CVD is used. The thickness of the sacrificial gate dielectric layer 62 is in a range from about 1 nm to about 5 nm in some embodiments. Further, as shown in FIG. 22E, a gate electrode 64 is formed. A hard mask layer 66 is formed on the gate electrode 64, similar to the process discussed with respect to FIG. 11A. Subsequently, processing discussed with respect to FIGS. 15-18 is performed on the device in FIG. 22E to obtain the device in FIG. 23.

Figure 23:
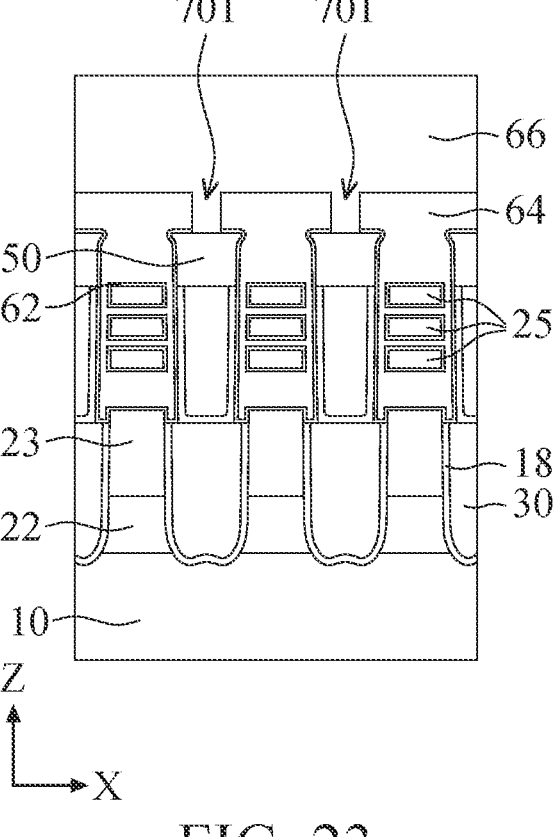
FIG. 23 illustrates the semiconductor device having wider third dielectric layer after the cut-metal gate (CMG) etching process and the deposition of CMG refill material.

FIG. 23 illustrates the semiconductor device having wider third dielectric layer 50 after the cut-metal gate (CMG) etching process and the deposition of CMG refill material, similar to the processes illustrated in FIGS. 17 and 18. Because of the wider third dielectric layer 50, a narrower CMG opening 701 can be used.

Figure 24:
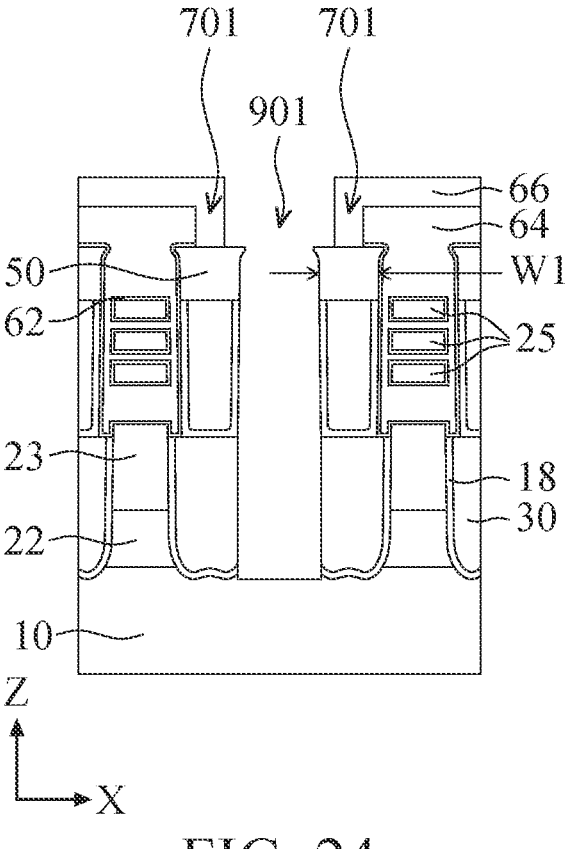
FIG. 24 illustrates the device in FIG. 23 including a trench formed using the process discussed above in FIG. 20.

FIG. 24 illustrates the device in FIG. 23 including a trench 901 formed using the process discussed above in FIG. 20. As seen, due to an increase in the CD (width) of the third dielectric layer 50, an area available to form the CMG opening 701 is increased. Thus, the possibility of the misalignment between the CMG opening 701 and the third dielectric layer 50 is reduced. Because the CD (width, W1) of the third dielectric layer 50 is increased, the CD of the CMG opening 701 can be made smaller and thus the work function of the gate electrode 64 can be improved. In some embodiments the CD (width, W1) of the third dielectric layer 50 is increased from about 10 nm (in FIGS. 9A-19) to about 20 nm. In some embodiments, the CD (width) of the third dielectric layer 50 is in a range from about 20 nm to about 40 nm, and is in a range from about 25 nm to about 35 nm in other embodiments. In some embodiments, a width of the third dielectric layer 50 at the bottom thereof is substantially equal to the sum of the width of the second dielectric layer 45 and twice the thickness of the first dielectric layer 40.

Figure 25:
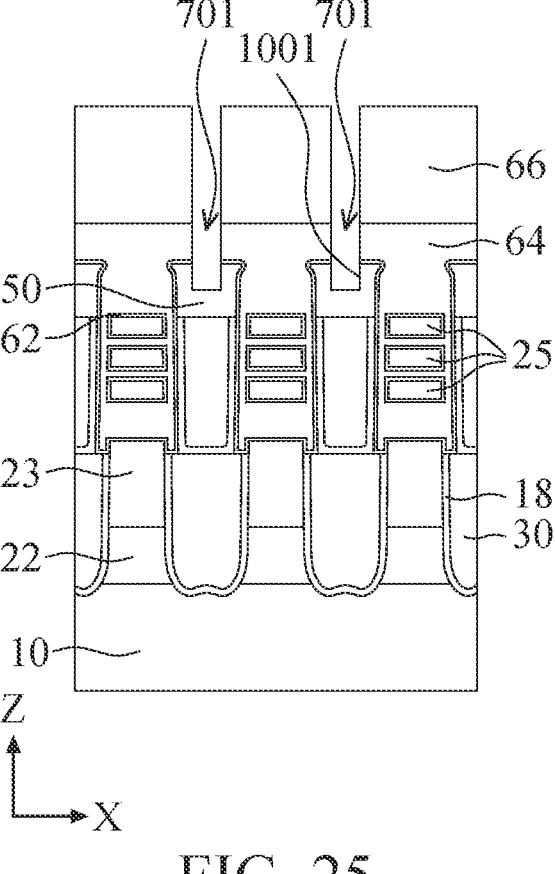
FIG. 25 illustrates the cut-metal gate (CMG) etching process (as in FIG. 17) on the device in FIG. 24 in which the CMG opening is extended into the third dielectric layer, thereby forming a recess.
Figure 26:
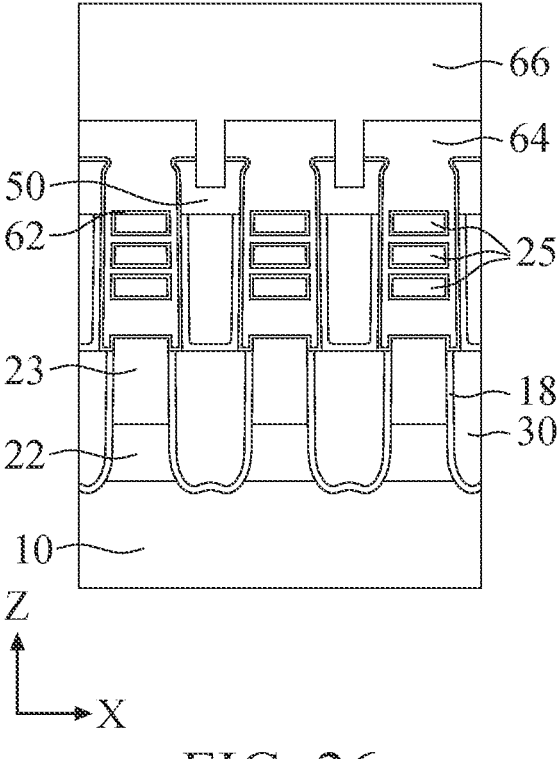
FIG. 26 illustrates CMG refill material including the material of the hard mask layer deposited in the CMG opening and the recess of FIG. 25.

In addition to, or as an alternative to, increasing the CD (width) of the third dielectric layer 50, a recess can be formed in the wider third dielectric layer 50 and CMG refill material can be deposited in the recess. FIG. 25 illustrates the cut-metal gate (CMG) etching process (as in FIG. 17) on the device in FIG. 24 in which the CMG opening 701 is extended into the third dielectric layer 50, thereby forming a recess 1001. The CD (width) of the CMG opening 701 is narrower than the width of the CMG opening 701 in the FIG. 17. FIG. 26 illustrates CMG refill material including the material of the hard mask layer 66 deposited in the CMG opening 701 and the recess 1001. Embodiments of the disclosure advantageously improve the alignment between the CMG opening 701 and the third dielectric layer 50. As a result, a narrower CMG opening 701 can be formed and the work function of the gate electrode 64 is improved.

Figure 27:
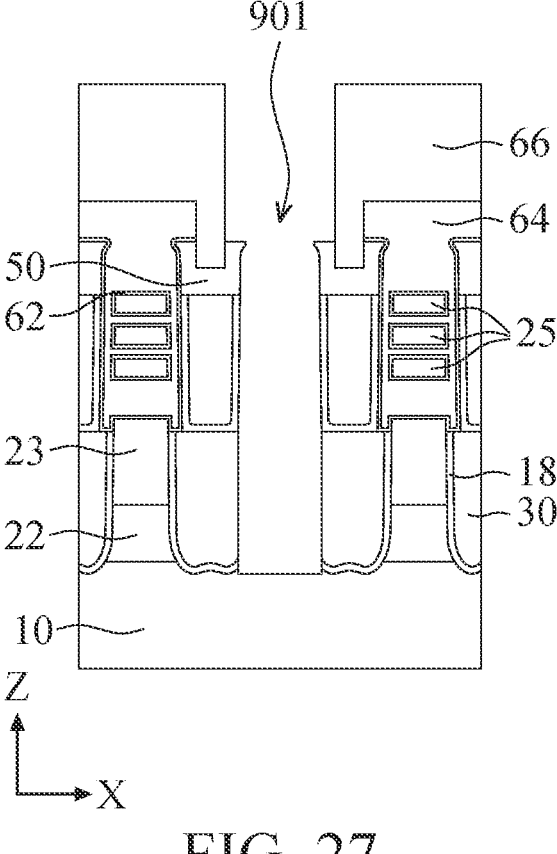
FIG. 27 illustrates the device in FIG. 26 including a trench formed using the process discussed above in FIG. 20.

FIG. 27 illustrates the device in FIG. 26 including a trench 901 formed using the process discussed above in FIG. 20.

Figure 28:
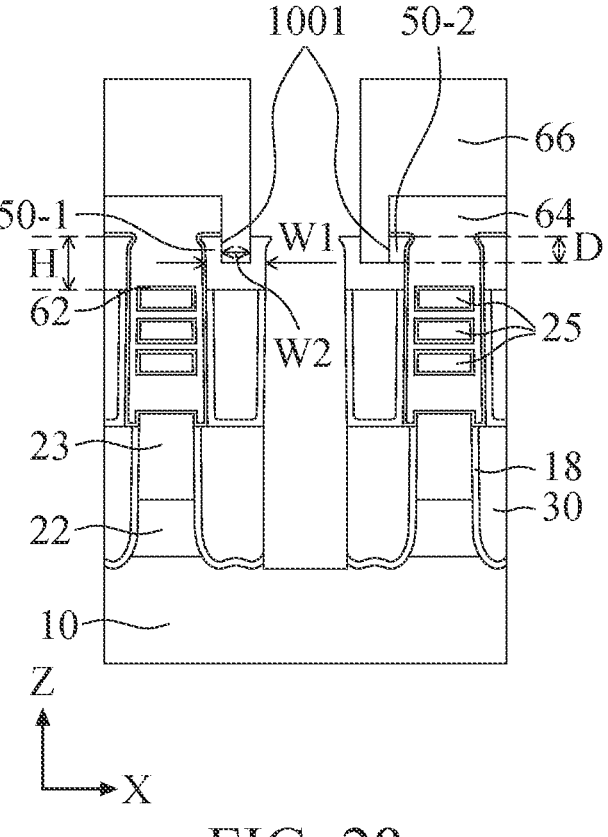
FIG. 28 illustrates a semiconductor device including recesses in not all the third dielectric layers according to embodiments of the disclosure.

The semiconductor device can be manufactured to include wider third dielectric layers 50 and third dielectric layers 50 including recesses. Similarly, the semiconductor device can be manufactured to include recesses only in some of the third dielectric layers. FIG. 28 illustrates a semiconductor device including recesses in not all the third dielectric layers 50 according to embodiments of the disclosure. Referring to FIG. 28, third dielectric layers 50-1 and 50-2 have recesses 1001.

In some embodiments, a depth D of the recesses 1001 is in a range from about 13 nm to about 22 nm. In some embodiments, the width W1 of the third dielectric layers 50 is in a range from about 14 nm to about 20 nm. In some embodiments, the width W2 of the CMG opening 701 is in a range from about 8 nm to about 12 nm. In some embodiments, the height H of the third dielectric layers 50 is in a range from about 30 nm to about 33 nm. In some embodiments, the ratio of the widths W1 and W2 is in a range from about 1.5 to about 3.5.

Figure 29:
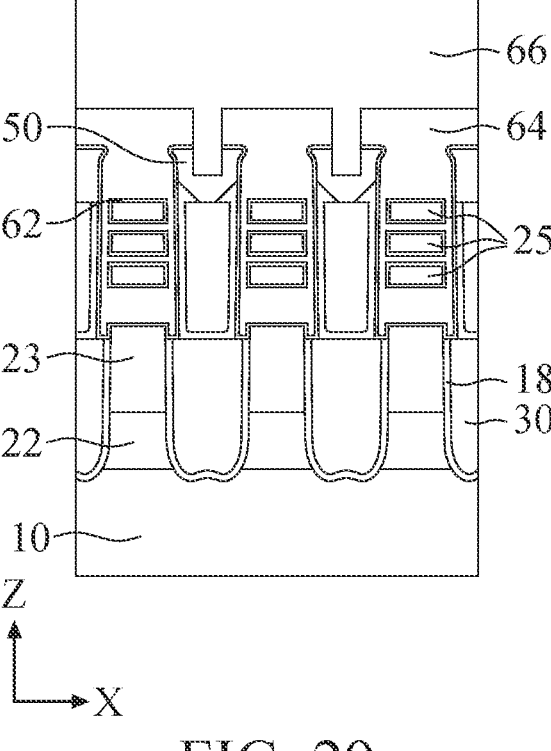
FIG. 29 illustrates the bottom portions of the third dielectric layers being V-shaped, according to some embodiments of the disclosure.

Referring to FIG. 29, the bottom portions of the third dielectric layers 50 may be V-shaped, or similar, in some embodiments. In some other embodiments, the bottom portions may be U-shaped or may have any other shape.

Figure 30:
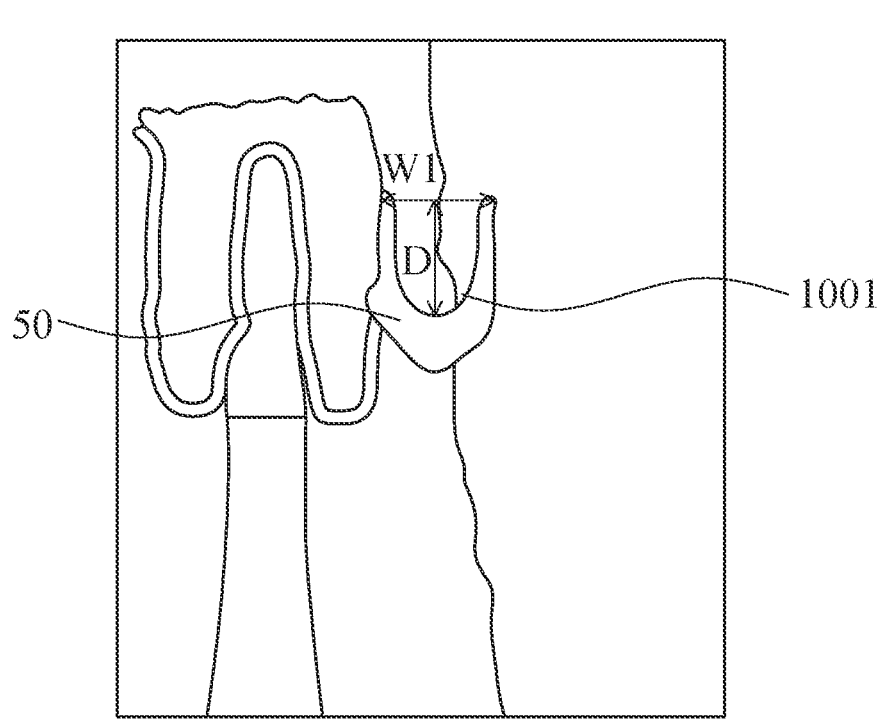
FIG. 30 illustrates a FinFET device fabricated using the process, according to some embodiments of the disclosure.

FIG. 30 illustrates a FinFET device 3000 fabricated using the process according to embodiments disclosed herein. In some embodiments, the width W1 of the third dielectric layers 50 is about 20 nm. In some embodiments, a depth D of the recesses 1001 is about 26 nm.

Embodiments of the disclosure advantageously improve the alignment between the CMG opening 701 and the third dielectric layer 50. As a result, a narrower CMG opening 701 can be formed and the work function of the gate electrode 64 is improved. It will be understood that not all advantages have been necessarily discussed herein, no particular advantage is required for all embodiments or examples, and other embodiments or examples may offer different advantages.

In accordance with an aspect of the present disclosure, a method of manufacturing a semiconductor device includes forming a fin structure including a stacked layer of first semiconductor layers and second semiconductor layers disposed over a bottom fin structure and a first hard mask layer over the stacked layer. An isolation insulating layer is formed so that the first hard mask layer and the stacked layer are exposed from the isolation insulating layer. A sacrificial cladding layer is formed over at least sidewalls of the exposed first hard mask layer and stacked layer. A first dielectric layer is formed. A second dielectric layer made of a different material than the first dielectric layer over the first dielectric layer is formed. The second dielectric layer is recessed. The first dielectric layer exposed after recessing the second dielectric layer is removed. A third dielectric layer made of a different material than the second dielectric layer on the recessed second dielectric layer is formed and, thereby a wall fin structure is formed. The first hard mask layer is removed. A gate electrode layer is formed on the third dielectric layer and portions occupied by the hard mask layer prior to removal. A second hard mask layer on the gate electrode layer is formed. An opening in the second hard mask layer over the third dielectric layer is formed. An opening in a cut-metal gate (CMG) region is formed by removing portions of the gate electrode layer exposed in the opening to expose upper portions of the third dielectric layer. A refill material is deposited in the opening, wherein in a cross-sectional view the refill material in the opening lies entirely within the third dielectric layer. In some embodiments, removing the first dielectric layer includes removing the first dielectric layer to expose the sacrificial cladding layer over at least the sidewalls and above the second dielectric layer. In some embodiments, forming the third dielectric layer includes depositing the third dielectric layer over the first hard mask layer and the sacrificial cladding layer; and planarizing the third dielectric layer to expose upper portions of the first hard mask layer. In some embodiments, wherein the sacrificial cladding layer is amorphous or polycrystalline. In some embodiments, the second hard mask layer includes at least one of silicon nitride, silicon oxide or SiON. In some embodiments, the refill material is the same as the material of the second hard mask layer. In some embodiments, a ratio of a width of the third dielectric layer and a width of the opening in the cut-metal gate (CMG) region is in a range from about 1.5 to about 3.5. In some embodiments, the width of the third dielectric layer is in a range from 14 nm to 40 nm, and the width of the opening in the cut-metal gate (CMG) region is in a range from 8 nm to 12 nm. In some embodiments, a height of the third dielectric layer is in a range from 30 nm to 33 nm. In some embodiments, removing the fin structure between adjacent third dielectric layers and the bottom fin structure beneath the find structure to form a trench.

In accordance with another aspect of the present disclosure, a method of manufacturing a semiconductor device includes forming a fin structure including a stacked layer of first semiconductor layers and second semiconductor layers disposed over a bottom fin structure and a first hard mask layer over the stacked layer. An isolation insulating layer is formed so that the first hard mask layer and the stacked layer are exposed from the isolation insulating layer. A sacrificial cladding layer is formed over at least sidewalls of the exposed first hard mask layer and stacked layer. A first dielectric layer is formed. A second dielectric layer made of a different material than the first dielectric layer over the first dielectric layer is formed. The second dielectric layer is recessed. The first dielectric layer exposed after recessing the second dielectric layer is removed. A third dielectric layer made of a different material than the second dielectric layer is formed on the recessed second dielectric layer, and thereby a wall fin structure is formed. The first hard mask layer is removed. A gate electrode layer on the third dielectric layer and portions occupied by the hard mask layer are formed prior to removing the first hard mask layer. A second hard mask layer is formed on the gate electrode layer. An opening is formed in the second hard mask layer over the third dielectric layer. An opening is formed in a cut-metal gate (CMG) region and the third dielectric layer by removing portions of the gate electrode layer exposed in the opening and the third dielectric layer, thereby forming a recess in the third dielectric layer. A refill material is deposited in the opening and the recess. In some embodiments, in a cross-sectional view the refill material in the opening and the recess lies entirely within the third dielectric layer. In some embodiments, in a cross-sectional view the refill material in the opening and the recess lies entirely within the third dielectric layer. In some embodiments, a ratio of a width of the third dielectric layer and a width of the opening in the cut-metal gate (CMG) region is in a range from about 1.5 to about 3.5. In some embodiments, the width of the third dielectric layer is in a range from 14 nm to 40 nm, and the width of the opening in the cut-metal gate (CMG) region is in a range from 8 nm to 12 nm. In some embodiments, a height of the third dielectric layer is in a range from 30 nm to 33 nm. In some embodiments, a depth of the recess is in a range from 13 nm to 22 nm.

In accordance with another aspect of the present disclosure, a semiconductor device includes a first gate-all-around field effect transistor (GAA FET) and a second GAA FET, and a wall fin disposed between the first GAA FET and the second GAA FET and disposed on an isolation insulating layer. The wall fin includes a first dielectric layer, a second dielectric layer disposed over the first dielectric layer and a third dielectric layer, the first, second and third dielectric layers are made of different materials from each other, and the third dielectric layer includes a recess. In some embodiments, a ratio of a width W1 of the third dielectric layer and a width W2 of the recess is in a range from about 1.5 to about 3.5. In some embodiments, the width of the third dielectric layer is in a range from 14 nm to 40 nm, and the width of the recess is in a range from 8 nm to 12 nm. In some embodiments, a depth of the recess is 13 nm to 22 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a fin structure including a stacked layer of first semiconductor layers and second semiconductor layers disposed over a bottom fin structure and a first hard mask layer over the stacked layer;

forming an isolation insulating layer so that the first hard mask layer and the stacked layer are exposed from the isolation insulating layer;

forming a sacrificial cladding layer over at least sidewalls of the exposed first hard mask layer and stacked layer;

forming a first dielectric layer;

forming a second dielectric layer made of a different material than the first dielectric layer over the first dielectric layer;

recessing the second dielectric layer;

removing the first dielectric layer exposed after recessing the second dielectric layer;

forming a third dielectric layer made of a different material than the second dielectric layer on the recessed second dielectric layer, thereby forming a wall fin structure;

removing the first hard mask layer;

forming a gate electrode layer on the third dielectric layer and portions occupied by the hard mask layer prior to removal;

forming a second hard mask layer on the gate electrode layer;

forming an opening in the second hard mask layer over the third dielectric layer;

forming an opening in a cut-metal gate (CMG) region by removing portions of the gate electrode layer exposed in the opening to expose upper portions of the third dielectric layer; and depositing a refill material in the opening, wherein in a cross-sectional view the refill material in the opening lies entirely within the third dielectric layer.

2. The method of claim 1, wherein removing the first dielectric layer includes removing the first dielectric layer to expose the sacrificial cladding layer over at least the sidewalls and above the second dielectric layer.

3. The method of claim 1, wherein forming the third dielectric layer includes depositing the third dielectric layer over the first hard mask layer and the sacrificial cladding layer; and planarizing the third dielectric layer to expose upper portions of the first hard mask layer.

4. The method of claim 1, wherein the sacrificial cladding layer is amorphous or polycrystalline.

5. The method of claim 1, wherein the second hard mask layer includes at least one of silicon nitride, silicon oxide or SiON.

6. The method of claim 1, wherein the refill material is the same as the material of the second hard mask layer.

7. The method of claim 1, wherein a ratio of a width of the third dielectric layer and a width of the opening in the cut-metal gate (CMG) region is in a range from about 1.5 to about 3.5.

8. The method of claim 7, wherein the width of the third dielectric layer is in a range from 14 nm to 40 nm, and the width of the opening in the cut-metal gate (CMG) region is in a range from 8 nm to 12 nm.

9. The method of claim 1, wherein a height of the third dielectric layer is in a range from 30 nm to 33 nm.

10. The method of claim 1, further comprising removing the fin structure between adjacent third dielectric layers and the bottom fin structure beneath the find-fin structure to form a trench.

11. A method of manufacturing a semiconductor device, comprising:

forming a fin structure including a stacked layer of first semiconductor layers and second semiconductor layers disposed over a bottom fin structure and a first hard mask layer over the stacked layer;

forming an isolation insulating layer so that the first hard mask layer and the stacked layer are exposed from the isolation insulating layer;

forming a sacrificial cladding layer over at least sidewalls of the exposed first hard mask layer and stacked layer;

forming a first dielectric layer;

forming a second dielectric layer made of a different material than the first dielectric layer over the first dielectric layer;

recessing the second dielectric layer;

removing the first dielectric layer exposed after recessing the second dielectric layer;

forming a third dielectric layer made of a different material than the second dielectric layer on the recessed second dielectric layer, thereby forming a wall fin structure;

removing the first hard mask layer;

forming a gate electrode layer on the third dielectric layer and portions occupied by the hard mask layer prior to removal;

forming a second hard mask layer on the gate electrode layer;

forming an opening in the second hard mask layer over the third dielectric layer;

forming an opening in a cut-metal gate (CMG) region and the third dielectric layer by removing portions of the gate electrode layer exposed in the opening and the third dielectric layer, thereby forming a recess in the third dielectric layer; and depositing a refill material in the opening and the recess.

12. The method of claim 11, wherein in a cross-sectional view the refill material in the opening and the recess lies entirely within the third dielectric layer.

13. The method of claim 11, wherein a ratio of a width of the third dielectric layer and a width of the opening in the cut-metal gate (CMG) region is in a range from about 1.5 to about 3.5.

14. The method of claim 13, wherein the width of the third dielectric layer is in a range from 14 nm to 40 nm, and the width of the opening in the cut-metal gate (CMG) region is in a range from 8 nm to 12 nm.

15. The method of claim 11, wherein a height of the third dielectric layer is in a range from 30 nm to 33 nm.

16. The method of claim 11, wherein a depth of the recess is in a range from 13 nm to 22 nm.

17. A method of manufacturing a semiconductor device, comprising:

forming a fin structure including a stacked layer of first semiconductor layers and second semiconductor layers disposed over a bottom fin structure and a first hard mask layer over the stacked layer;

forming an isolation insulating layer so that the first hard mask layer and the stacked layer are exposed from the isolation insulating layer;

forming a sacrificial cladding layer over at least sidewalls of the exposed first hard mask layer and stacked layer;

forming a first dielectric layer;

forming a second dielectric layer made of a different material than the first dielectric layer over the first dielectric layer;

recessing the second dielectric layer;

removing the first dielectric layer exposed after recessing the second dielectric layer;

forming a third dielectric layer made of a different material than the second dielectric layer on the recessed second dielectric layer, wherein the third dielectric layer on the recessed second dielectric layer directly contacts the sacrificial cladding layer over the sidewalls;

removing the first hard mask layer;

forming a gate electrode layer on the third dielectric layer and portions occupied by the hard mask layer prior to removal;

forming a second hard mask layer on the gate electrode layer;

forming an opening in the second hard mask layer over the third dielectric layer;

forming an opening in a cut-metal gate (CMG) region and the third dielectric layer by removing portions of the gate electrode layer exposed in the opening and the third dielectric layer, thereby forming a recess in the third dielectric layer;

depositing a refill material in the opening and the recess, wherein in a cross-sectional view the refill material in the opening and the recess lies entirely within the third dielectric layer.

18. The method of claim 17, further comprising removing the fin structure between adjacent third dielectric layers and the bottom fin structure beneath the fin structure to form a trench.

19. The method of claim 17, wherein the semiconductor device includes a plurality of third dielectric layers and at least one third dielectric layer of the plurality of third dielectric layers includes the recess and at least one third dielectric layer of the plurality of third dielectric layers does not include the recess.

20. The method of claim 17, wherein the refill material is the same as the material of the second hard mask layer.

* * * * *